US012278623B2

(12) United States Patent
Büthker et al.

(10) Patent No.: US 12,278,623 B2
(45) Date of Patent: Apr. 15, 2025

(54) POWER ON RESET (POR) CIRCUIT

(71) Applicant: NXP B.V., Eindhoven (NL)

(72) Inventors: Henricus Cornelis Johannes Büthker, Mierlo (NL); Jyotirmoy Ghosh, Kolkata (IN); Piotr Gibas, Eindhoven (NL); Edwin Schapendonk, Oss (NL); Neha Goel, Noida (IN); Namith Vishnu N, Aluva (IN)

(73) Assignee: NXP B.V., Eindhoven (NL)

( * ) Notice: Subject to any disclaimer, the term of this patent is extended or adjusted under 35 U.S.C. 154(b) by 53 days.

(21) Appl. No.: 18/332,522

(22) Filed: Jun. 9, 2023

(65) Prior Publication Data
US 2024/0356543 A1 Oct. 24, 2024

(30) Foreign Application Priority Data
Apr. 20, 2023 (IN) .............................. 202341028665

(51) Int. Cl.
*H03K 17/22* (2006.01)
*H03K 3/037* (2006.01)
(52) U.S. Cl.
CPC ........... *H03K 17/223* (2013.01); *H03K 3/037* (2013.01)
(58) Field of Classification Search
CPC .................... H03K 17/22; H03K 17/223
See application file for complete search history.

(56) References Cited

U.S. PATENT DOCUMENTS

| | | | |
|---|---|---|---|
| 5,212,412 A | 5/1993 | Atriss et al. | |
| 5,570,050 A | 10/1996 | Conary | |
| 6,812,751 B2 | 11/2004 | Sutandi et al. | |
| 7,057,427 B2 | 6/2006 | Wadhwa et al. | |
| 7,417,476 B1 | 8/2008 | Hung | |
| 7,671,643 B2 | 3/2010 | Dribinsky et al. | |
| 8,633,744 B1 | 1/2014 | Lu et al. | |
| 8,754,679 B2 | 6/2014 | Sanborn et al. | |
| 10,312,902 B2 | 6/2019 | Singh et al. | |

(Continued)

FOREIGN PATENT DOCUMENTS

| | | |
|---|---|---|
| CN | 211481249 U | 9/2020 |
| CN | 108768362 B | 11/2021 |

OTHER PUBLICATIONS

Ay, Suat U.; "A Nanowatt Cascadable Delay Element for Compact Power-on-Reset (POR) Circuits"; 2009 52nd IEEE International Midwest Symposium on Circuits and Systems; Aug. 2009; 4 pages.

(Continued)

*Primary Examiner* — Patrick O Neill (57) ABSTRACT

One example discloses a power on reset (POR) circuit, wherein a first circuit is configured to un-couple a power supply input from a resistor divider when the voltage on a second end of the capacitor is above a first circuit threshold; a second circuit configured to couple the second end of the capacitor to the power supply input when a voltage on at least one tap point of the resistor divider is above a second circuit threshold; wherein the comparator is coupled to at least one of the tap points, the reference potential, and a POR output; and wherein the comparator is configured to ramp-up a POR signal on the POR output when a voltage on the at least one of the tap points is greater than the comparator threshold.

21 Claims, 5 Drawing Sheets

(56) References Cited

U.S. PATENT DOCUMENTS

2014/0035634 A1* 2/2014 Shrivastava .......... G01R 21/00
                                                    327/143
2024/0305289 A1* 9/2024 Sharma ................ H03K 17/223

OTHER PUBLICATIONS

Song, Kinam et al.; "A UVLO with Zero Static Power Consumption Power-on Reset Circuit in HVIC"; 2017 IEEE Applied Power Electronics Conference and Exposition; Mar. 2017; 5 pages.
Guo, Jiashu et al.; "An Ultra-Low Quiescent Current Resistor-Less Power on Reset Circuit"; IEEE Transactions on Circuits and Systems—II: Express Briefs, vol. 68, No. 1, Jan. 2021; 5 pages.
Prakash, Rahul; "Zero Quiescent Current, Delay Adjustable, Power-on-Reset Circuit"; 2014 IEEE Dallas Circuits and Systems Conference; Oct. 2014; 4 pages.

* cited by examiner

POWER ON RESET (POR) CIRCUIT

CROSS-REFERENCE TO RELATED APPLICATIONS

This application claims the priority under 35 U.S.C. § 119 of Indian Patent Application number 202341028665, filed on 20 Apr. 2023, the contents of which are incorporated by reference herein.

The present specification relates to systems, methods, apparatuses, devices, articles of manufacture and instructions for resetting electronic devices upon power-on.

SUMMARY

According to an example embodiment, power on reset (POR) circuit, comprising: a power supply input configured to be coupled to a power supply voltage; a capacitor having a first end coupled to a reference potential; a resistor divider having a set of tap points, wherein at least one tap point is coupled to the reference potential; a comparator coupled to the power supply input and the reference potential, and having a comparator threshold dependent upon the power supply voltage; a first circuit coupled to a second end of the capacitor and configured to couple the power supply input to the resistor divider when a voltage on the second end of the capacitor is below a first circuit threshold; wherein the first circuit is configured to un-couple the power supply input from the resistor divider when the voltage on the second end of the capacitor is above the first circuit threshold; a second circuit configured to couple the second end of the capacitor to the power supply input when a voltage on at least one tap point of the resistor divider is above a second circuit threshold; wherein the comparator is coupled to at least one of the tap points, the reference potential, and a POR output; and wherein the comparator is configured to ramp-up a POR signal on the POR output when a voltage on the at least one of the tap points is greater than the comparator threshold.

In another example embodiment, the comparator is configured to ramp-down the POR signal on the POR output when the voltage on the at least one of the tap points is less than the comparator threshold.

In another example embodiment, the comparator threshold increases as the power supply voltage increases.

In another example embodiment, the first circuit is a single MOS transistor (M3).

In another example embodiment, the first circuit threshold is a voltage at the gate that turns-on the single MOS transistor.

In another example embodiment, a gate of the single MOS transistor is coupled to the second end of the capacitor and the second circuit.

In another example embodiment, a first doped region of the single MOS transistor is coupled to the power supply input; and wherein a second doped region of the single MOS transistor is coupled to the resistor divider.

In another example embodiment, the second circuit includes a first MOS transistor (M0) and a second MOS transistor (M2).

In another example embodiment, the second circuit threshold is a voltage at the gate that turns-on the first MOS transistor.

In another example embodiment, a gate of the first MOS transistor is coupled to the at least one tap point of the resistor divider; a first doped region of the first MOS transistor is coupled to the reference potential; a second doped region of the first MOS transistor is coupled to a gate of the second MOS transistor; and a first doped region of the second MOS transistor is coupled to the power supply input.

In another example embodiment, a second doped region of the second MOS transistor is coupled to the first circuit and the second end of the capacitor.

In another example embodiment, the first circuit is a single MOS transistor (M3); and the second doped region of the second MOS transistor is coupled to a gate of the single MOS transistor in the first circuit.

In another example embodiment, the first circuit is a single MOS transistor (M3); the second circuit includes a first MOS transistor (M0) and a second MOS transistor (M2); the single MOS transistor is a PMOS transistor; the first MOS transistor of the second circuit is an NMOS transistor; the second MOS transistor of the second circuit is a PMOS transistor; and the reference potential is a ground potential.

In another example embodiment, the comparator includes a PMOS transistor and an NMOS transistor coupled as an inverter having an inverter threshold.

In another example embodiment, gates of both transistors are coupled to a same tap point in the resistor divider; and drains of both transistors are coupled to the POR output.

In another example embodiment, the comparator threshold is the inverter threshold; the inverter is configured to ramp-up the POR signal on the POR output when the voltage on the at least one of the tap points is greater than the inverter threshold; and the inverter is configured to ramp-down the POR signal on the POR output when the voltage on the at least one of the tap points is less than the inverter threshold.

In another example embodiment, the comparator includes a logic gate having a first input coupled to the at least one of the tap points and a second input coupled to the reference potential.

In another example embodiment, the comparator threshold is a logic decision threshold within the logic gate; the logic gate is configured to ramp-up the POR signal on the POR output when the voltage on the at least one of the tap points is greater than the logic decision threshold; and the logic gate is configured to ramp-down the POR signal on the POR output when the voltage on the at least one of the tap points is less than the logic decision threshold.

In another example embodiment, the logic gate is at least one of an AND gate, a NAND gate, an OR gate, a NOR gate, an XOR gate, or an XNOR gate.

In another example embodiment, further comprising a logic inverter coupled between an output of the logic gate and the POR output.

According to an example embodiment, a power on reset (POR) circuit, comprising: a power supply input configured to be coupled to a power supply voltage; a capacitor having a first end coupled to the power supply input; a resistor divider having a set of tap points, wherein at least one tap point is coupled to the power supply input; a comparator coupled to the power supply input and a reference potential, and having a comparator threshold dependent upon the power supply voltage; a first circuit coupled to a second end of the capacitor and configured to couple the reference potential to the resistor divider when a voltage on the second end of the capacitor is above a first circuit threshold; wherein the first circuit is configured to un-couple the power supply input from the resistor divider when the voltage on the second end of the capacitor is below the first circuit threshold; a second circuit configured to couple the second end of the capacitor to the reference potential when a voltage on at least one tap point of the resistor divider is below a second circuit threshold; wherein the comparator is coupled to at least one of the tap points, the power supply input, and a POR output; and wherein the comparator is configured to ramp-up a POR signal on the POR output when a voltage on the at least one of the tap points is less than the comparator threshold.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Two types of power on reset (POR) circuits exist: level-based and delay-based. Level-based PORs tend to have accurate detection levels, but consume a constant current, resulting in higher power losses. Delay-based PORs need a minimum power supply dV/dt to operate and have ill-defined detection levels.

Now discussed are example POR circuits having well defined detection levels and that consume minimal or even no static current. These example POR circuits generate their POR pulse during power supply ramp-up when the power supply voltage amplitude is between an adjustable set of voltage levels.

In some example embodiments, these POR circuits are configured to generate the POR pulse using a combination of a set of transistors, configured into a feedback loop for generating a stable reference signal, and a comparator, having a voltage supply dependent comparator threshold (i.e. that varies with the power supply voltage) to generate the POR pulse.

The set of transistors are configured to generate a voltage reference (e.g. fixed amplitude) that when compared to a slewing comparator threshold during power-up generates the POR pulse.

In some example embodiments, the voltage reference is defined by a gate-source threshold voltage of an NMOS transistor, while the comparator threshold is defined by a balance between a set of NMOS and PMOS thresholds in an inverter configuration. The POR pulse also does not depend on the power supply dV/dt.

Figure 1:
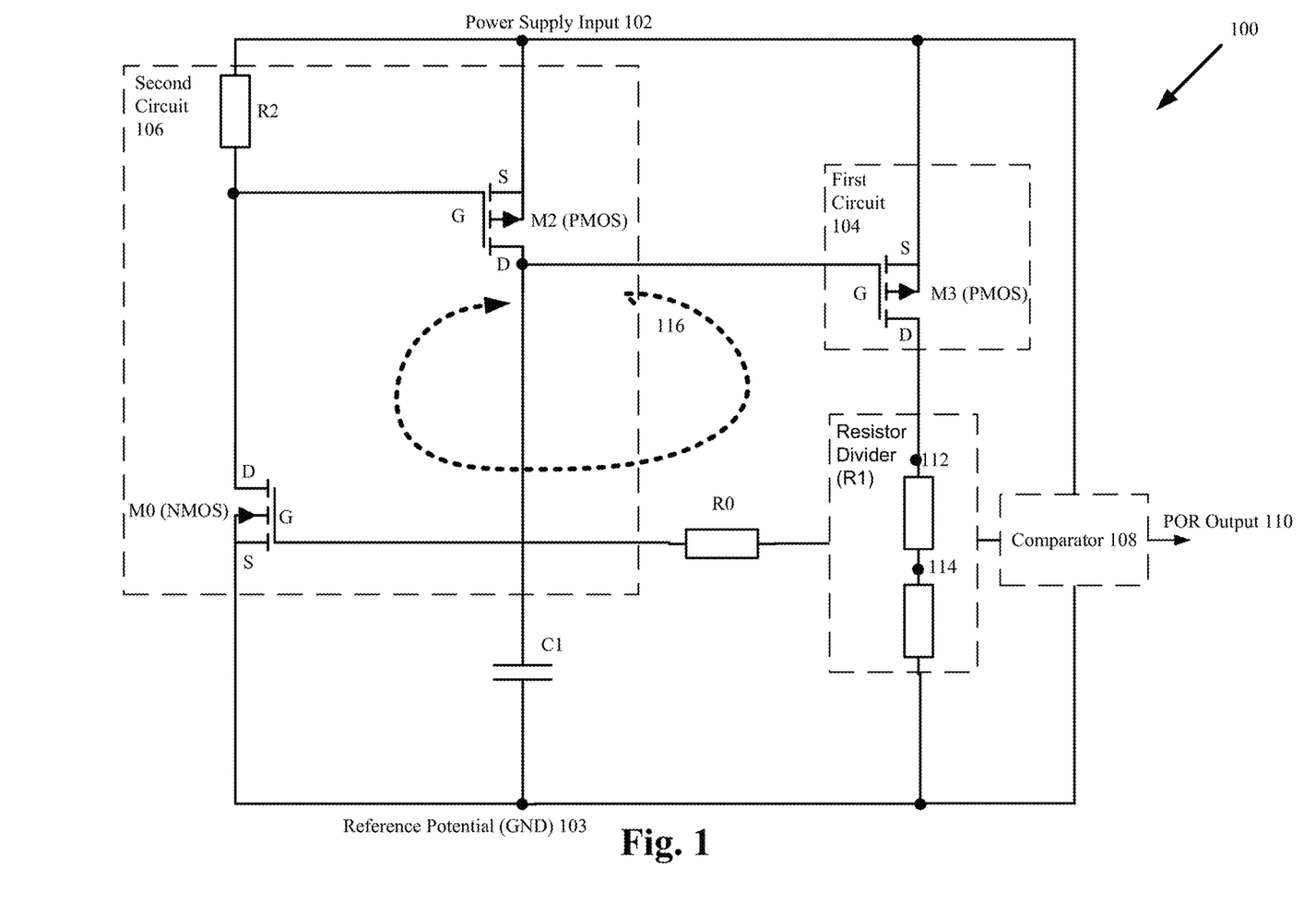
FIG. 1 represents a first example of a power-on reset (POR) circuit.

FIG. 1 represents a first example 100 of a power-on reset (POR) circuit. The first example POR circuit 100 includes a power supply input 102 configured to be coupled to a power supply voltage (Vcc), a reference potential (e.g. a ground potential, GND) 103, a capacitor (C1), a first circuit 104 (e.g. M3, PMOS), a resistor divider (R1) having a set of tap points (e.g. tap points 112, 114), a second circuit 106 having a first MOS transistor (M0, NMOS) and a second MOS transistor (M2, PMOS), a comparator 108 having a comparator threshold, and a POR output 110. The first circuit 104, resistor divider (R1), and second circuit 106 together form a feedback loop 116.

As shown in FIG. 1, the capacitor (C1) has a first end coupled to a reference potential 103 and a second end coupled to both M3 and M2. The first circuit 104 is coupled to the second end of the capacitor (C1) and configured to couple the power supply input 102 to the resistor divider (R1) when a voltage on the second end of the capacitor (C1) is below a first circuit threshold. The first circuit 104 then un-couples the power supply input 102 from the resistor divider (R1) when the voltage on the second end of the capacitor (C1) is above the first circuit 104 threshold, thus preventing the POR circuit from drawing any static current.

In some example embodiments, the first circuit 104 is a single MOS transistor (M3) as shown in FIG. 1. A first doped region (e.g. source node) of the single MOS transistor is coupled to the power supply input 102 and a second doped region (e.g. drain node) of the single MOS transistor is coupled to the resistor divider (R1). A gate of the single MOS transistor is coupled to the second end of the capacitor (C1) and M2 in the second circuit 106. Herein defined is a first circuit threshold that is a voltage at the gate of M3 that turns-on the single MOS transistor (M3).

The first circuit's 104 M3 (PMOS) gate-source capacitance forms a capacitive divider with C1 to detect a rise of supply voltage. C1 is selected to have a much larger capacitance than the M3 gate-source capacitance so that as the power supply voltage on the M3 source rises during Vcc ramp-up, the M3 gate will remain close to the reference potential (GND) 103.

When the M3 gate threshold voltage (e.g. the first circuit threshold voltage) is reached, M3 will start to conduct and current from the supply voltage (Vcc) on the power supply input 102 will flow through the resistor divider (R1) resistors. The voltage across the R1 resistors is then almost equal to the power supply voltage (Vcc).

The second circuit 106 is configured to couple the second end of the capacitor (C1) to the power supply input 102 when a voltage on at least one tap point (e.g. 112, 114) in the resistor divider (R1) is above a second circuit threshold. At least one of the resistor divider (R1) tap points (note: not all tap points are shown or labeled) is also coupled to the reference potential 103.

The second circuit 106 includes a first MOS transistor (M0) and a second MOS transistor (M2). The gate of the first MOS transistor (M0) is coupled to at least one tap point of the resistor divider (R1). Herein defined is a second circuit threshold that is a voltage at the gate of M0 that turns-on the first MOS transistor (M0). Also, a first doped region (e.g. source) of the first MOS transistor (M0) is coupled to the reference potential 103, and a second doped region (e.g. drain) of the first MOS transistor (M0) is coupled to a gate of the second MOS transistor (M2) and to R2.

A first doped region (e.g. source) of the second MOS transistor is coupled to the power supply input 102, and a second doped region (e.g. drain) of the second MOS transistor (M2) is coupled to both the first circuit 104 (i.e. gate of M3) and the second end of the capacitor (C1).

The M0 (NMOS) transistor in the second circuit 106 will start to conduct when the voltage on tap point (e.g. 112 or 114) in R1 exceeds the gate threshold of M0 (e.g. the second circuit threshold voltage). This will pull down the gate of M2 (PMOS) in the second circuit 106 to the reference potential (GND) 103, thereby turning on M2.

When M2 is turned-on, M2 pulls up the capacitor (C1) voltage and the gate of M3 to the power supply voltage on the power supply input 102, thereby turning M3 in the first circuit 104 off. As long as Vcc is increasing, M3 will remain on. The current through M2 charges C1 and in this way keeps the Gate-Source voltage of M3 constant.

Together the M0, M2 and M3 transistors form the feedback loop 116 which generates a voltage reference (e.g. fixed amplitude) at each of the tap points 112, 114 of the resistor divider (R1).

This feedback loop 116 makes the voltage reference independent of the dV/dt ramp-rate of the power supply voltage (Vcc) on the power supply input 102.

In various example embodiments, R0 adds a dominant pole in a gain of the feedback loop 116 for further stability of the voltage across the R1 resistors.

The voltage reference is then received by the comparator 108 for generating the POR pulse on the POR output 110.

During ramp-down, when the power supply voltage Vcc drops back down to zero volts, any charge remaining on the capacitor C1 is discharged through a body diode in the M2 transistor. With the capacitor C1 voltage back to zero volts, the POR circuit 100 is reset and ready for a next power-up cycle.

The comparator 108 is coupled to the power supply input 102 and the reference potential 103. The comparator 108 has a comparator threshold dependent upon the power supply voltage. The comparator threshold increases as the power supply voltage increases.

The comparator 108 is coupled to at least one of the tap points, the reference potential 103, and the POR output 110. The comparator 108 is configured to ramp-up a POR signal on the POR output when the voltage on at least one of the tap points is greater than the comparator threshold. The comparator 108 is also configured to ramp-down the POR signal on the POR output when the voltage on at least one of the tap points is less than the comparator threshold.

By connecting the comparator 108 and second circuit 106 to various tap points 112, 114 in the resistor divider (R1) an amplitude of the voltage reference can be adjusted.

For example, by connecting the gate of M0 to the tap point 112 in R1 and the comparator 108 to the tap point 114, then the voltage reference can be made lower than the second circuit gate threshold voltage at M0 that turns-on the first MOS transistor (M2). However, if the gate of M0 is connected to the tap point 114, and the comparator 108 is coupled to the tap point 112, then the voltage reference at the tap point 112 is higher than the second circuit gate threshold voltage at M2. Thus the amplitude of the voltage reference can be adjusted as desired.

Only during supply ramp-up some current will be flowing. If the power supply voltage is stable, leakage in M2 will cause M3 to gradually turn off and no current will be drawn from the power supply input 102.

The POR circuit 100 discussed is not sensitive to short peaks or dips as the amplitude of the peak needs to exceed the gate threshold voltage of M3. Also, if the power supply voltage is high enough, the ramp-up voltage on the drain of M3 will not cause a spurious POR pulse at the POR output 110.

Figure 2A:
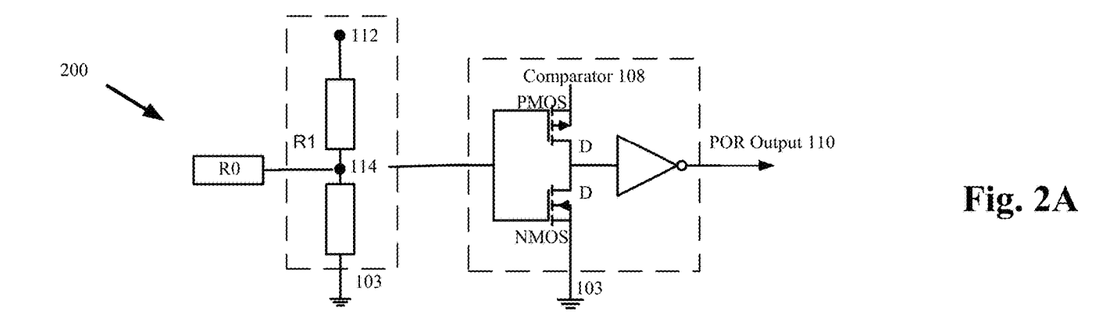
FIG. 2A represents a first example comparator within the POR circuit.

FIG. 2A represents a first example comparator 200 within the POR circuit 100. The comparator 200 includes a PMOS transistor and an NMOS transistor in an inverter configuration having an inverter threshold and a second inverter in cascade. Gates of both transistors are coupled to a same tap point (112 or 114 depending upon an example embodiment) in the resistor divider (R1). Drains of both transistors are coupled to the POR output 110.

The comparator threshold discussed in FIG. 1 becomes the inverter threshold in this example. The inverter is configured to ramp-up the POR signal on the POR output 110 when the voltage on the at least one of the tap points is greater than the inverter threshold. The inverter used for the comparator function need not be high-quality.

Figure 2B:
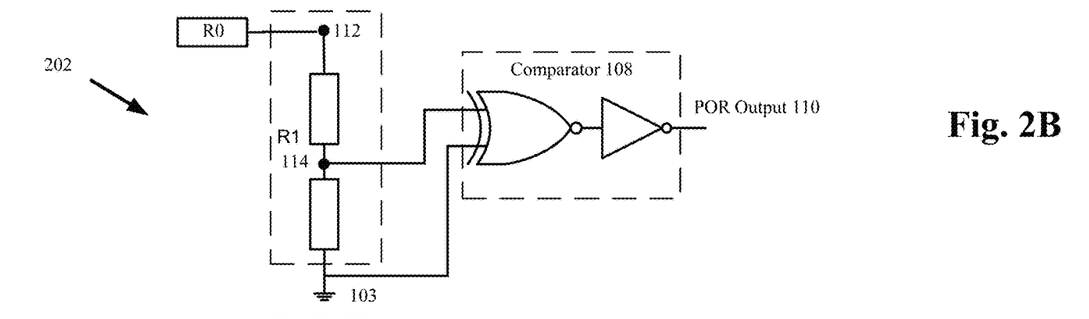
FIG. 2B represents a second example comparator within the POR circuit.
Figure 2C:
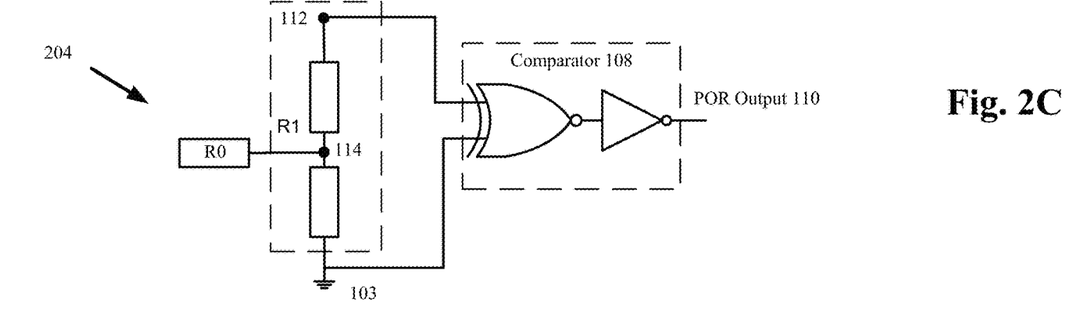
FIG. 2C represents a third example comparator within the POR circuit.

FIGS. 2B and 2C represent second and third example comparators 202, 204 within the POR circuit 100. Here the comparators 202, 204 include one or more logic gates having a first input coupled to the at least one of the tap points 112 or 114, and a second input coupled to the reference potential 103.

The comparator threshold is a logic decision threshold within the logic gate. Only a portion of these logic gates containing inverter-like structures, need be used as a zero-current comparator 108.

The logic gate(s) is/are configured to ramp-up a POR signal on the POR output 110 when a voltage on the at least one of the tap points 112 or 114 is greater than the logic decision threshold. The logic gate(s) is/are also configured to ramp-down the POR signal on the POR output 110 when the voltage on the at least one of the tap points is less than the logic decision threshold.

In various example embodiments, the logic gate can be an AND gate, a NAND gate, an OR gate, a NOR gate, an XOR gate, or an XNOR gate. In some example embodiments, the logic gate is followed by additional logic circuits such as a logic inverter (shown in FIGS. 2B and 2C) before the POR pulse signal is presented on the POR output 110.

In some example embodiments, the FIG. 2B second comparator 202 can be thought of as a higher-voltage comparator/inverter, and the FIG. 2C third comparator 204 can be thought of as a lower-voltage comparator/inverter.

Note that use of the XNOR or XOR logic gates shown in FIGS. 2B and 2C is just one of many possible example logic gate embodiments. One advantage of the XOR or XNOR however is that a polarity of the output pulse can be inverted by connecting the grounded input to the supply.

Figure 3A:
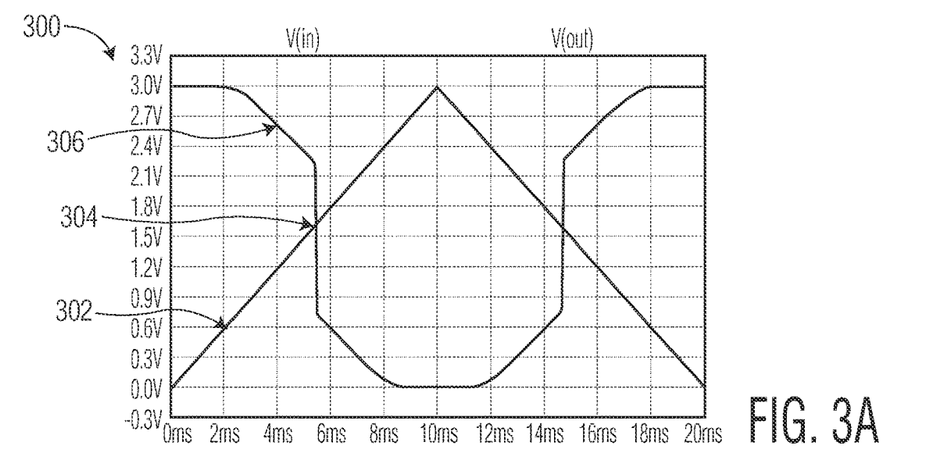
FIG. 3A represents a first operational example of the POR circuit.

FIG. 3A represents a first operational example 300 of the POR circuit 100. In this example there is only one inverter such as shown in FIG. 2A.

Example 300 shows a voltage reference 302 from the resistor divider (R1), a single inverter threshold 304, and a first POR pulse 306. Note only "select portions" of the voltage reference 302 from R1 are shown here. See FIG. 4 for a more complete voltage reference curve that includes both "variable" and relatively "fixed/stable" portions.

In this example 300, the power supply voltage was 3V. A sharp transition of the single inverter 304 at about 50% of the power supply voltage is shown, indicating a high gain.

Figure 3B:
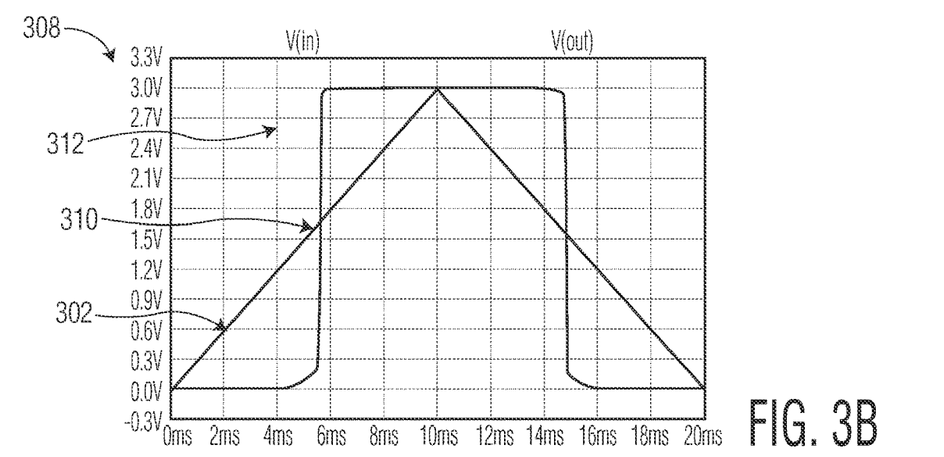
FIG. 3B represents a second operational example of the POR circuit.

FIG. 3B represents a second operational example 308 of the POR circuit 100. In this example two inverters are cascaded such as shown in FIGS. 2B and 2C.

Example 308 shows the voltage reference 302 from the resistor divider (R1), a cascaded inverter threshold 310, and a second POR pulse 312. When the voltage reference 302 is high or low, there is no power supply current flowing. Only during a transition there is a current. The cascaded inverter threshold 310 is roughly at 50% of the power supply voltage.

Figure 3C:
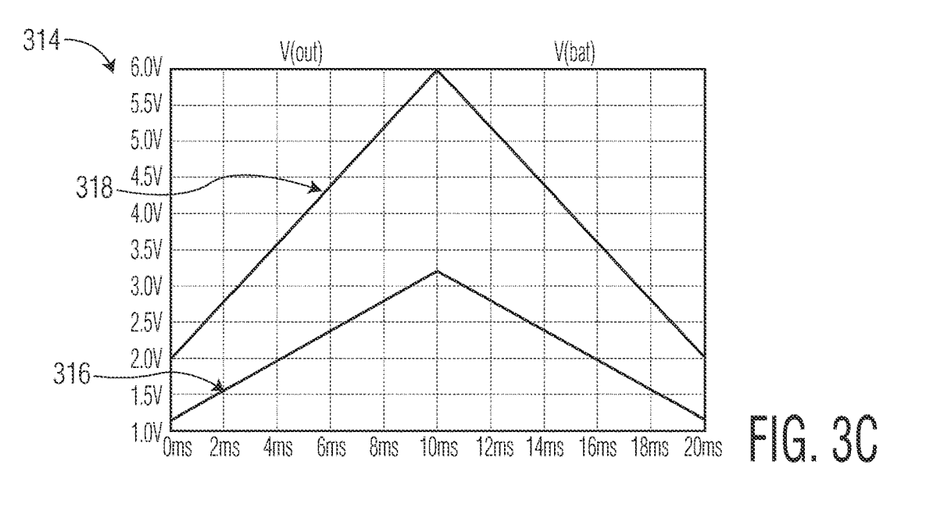
FIG. 3C represents an example of a dependence of a comparator's comparator threshold with the comparator's received power supply voltage.

FIG. 3C represents an example 314 of a dependence of a comparator's comparator threshold 316 with the comparator's received power supply voltage 318. As mentioned above, the comparator's 108 comparator threshold increases as the power supply voltage on the power supply input 102 increases.

In this example 314, two inverters in cascade can thus be used for the comparator 108 with the comparator threshold at 50% of the power supply voltage and zero static current consumption. In steady state, the power supply voltage is not changing and M3 is not conducting. The comparator 108 input will be low and its output is high. It can be inverted once more to obtain a logic low. No current is flowing as all devices are off and there is no resistive path.

Figure 4:
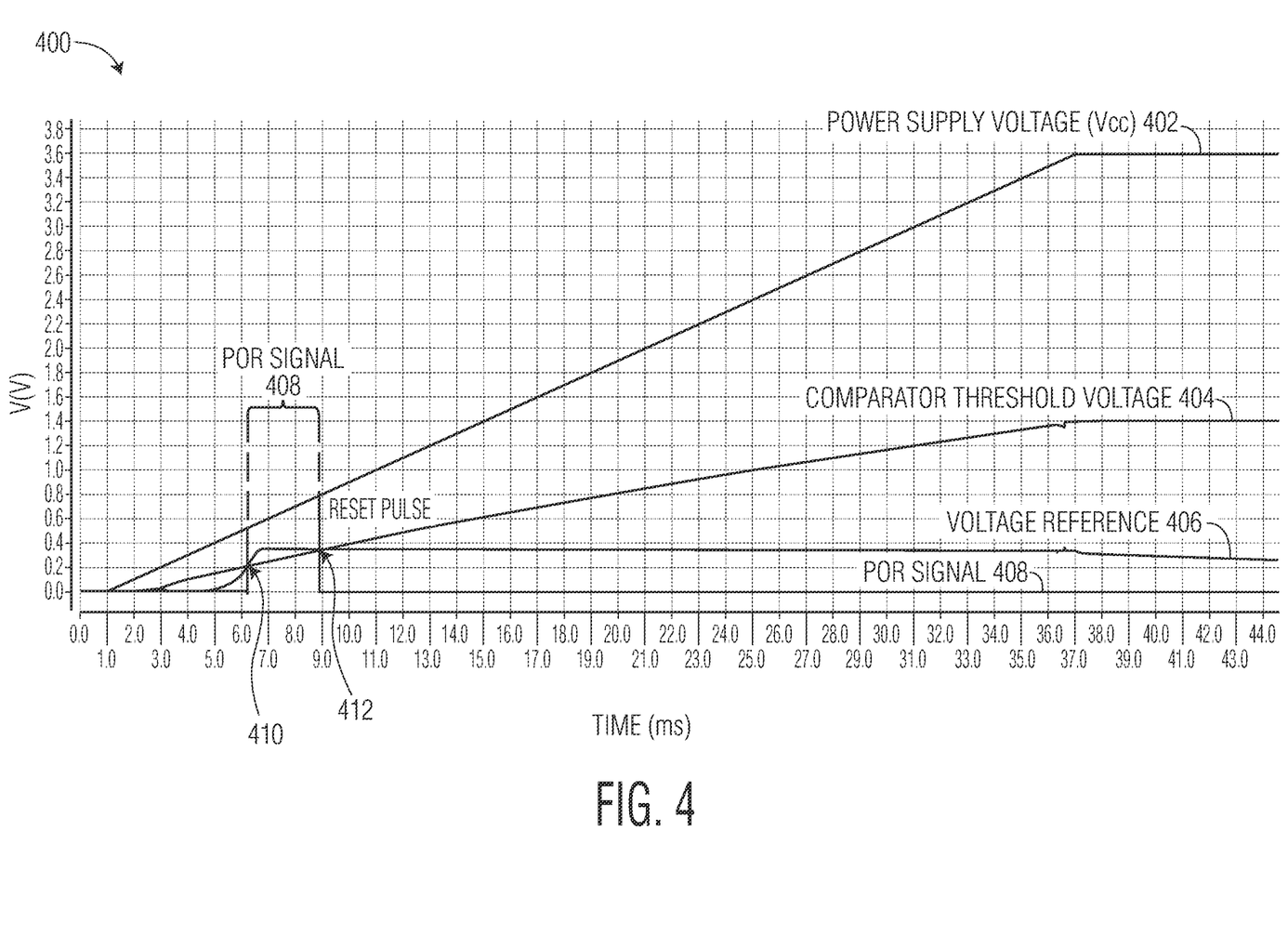
FIG. 4 represents an example set of waveforms within the POR circuit that generate a POR signal on a POR output.

FIG. 4 represents an example set of waveforms 400 within the POR circuit 100 that generate the POR signal on a POR output 110. The example waveforms 400 include a power supply voltage (Vcc) 402, a comparator threshold voltage 404, a reference voltage 406 from the resistor divider (R1), and a POR signal 408 to be sent to various other circuits (not shown) during power-up.

These example set of waveforms 400 correspond to the POR circuit 100 shown in FIG. 1. The POR pulse is only generated when the power supply voltage (Vcc) 402 is between certain voltage levels, as shown in FIG. 4.

The comparator 108 is configured to ramp-up the POR signal 408 on the POR output when a voltage on the at least one of the tap points is greater than 410 the comparator threshold. The comparator 108 is also configured to ramp-down the POR signal 408 on the POR output when the voltage on the at least one of the tap points is less than 412 the comparator threshold.

Figure 5:
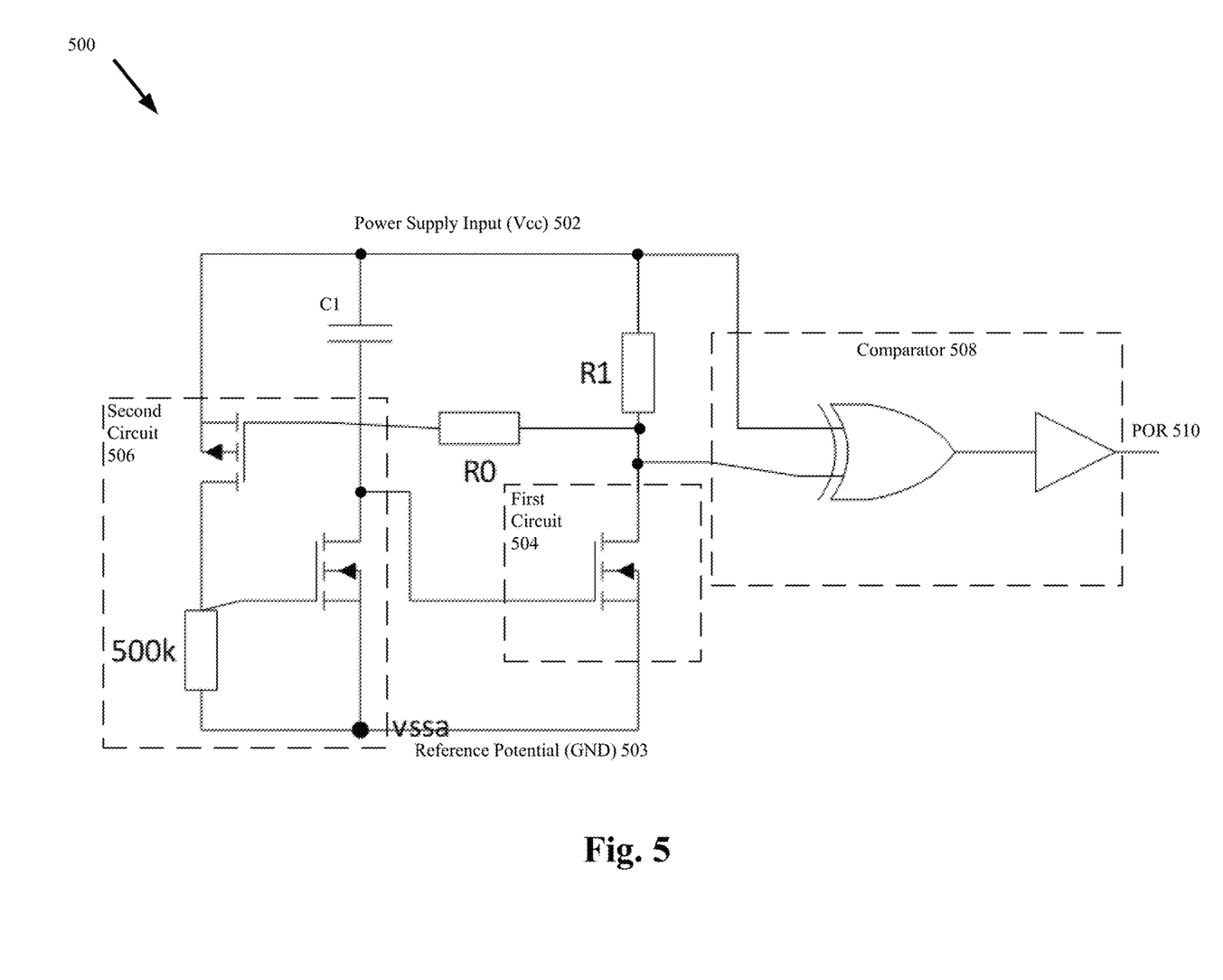
FIG. 5 represents a second example of the POR circuit.

FIG. 5 represents a second example 200 of the POR circuit. The second example POR circuit 500 includes a power supply input 502, a reference potential 503, a capacitor (C1), a first circuit 504 (e.g. NMOS), a resistor divider (R1), a second circuit 506 having a first MOS transistor (e.g. PMOS) and a second MOS transistor (e.g. NMOS), a comparator 508 having a comparator threshold, and a POR output 510. The first circuit 504, resistor divider (R1), and second circuit 506 together form the feedback loop.

The second example 200 of the POR circuit is essentially a mirror image of the first example 100 of the POR circuit where certain connection points and the PMOS and NMOS transistors have been switched. The second example POR circuit 200 operates essentially the same as the first example POR circuit 100.

It will be readily understood that the components of the embodiments as generally described herein and illustrated in the appended figures could be arranged and designed in a wide variety of different configurations. Thus, the detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

We claim:

1. A power on reset (POR) circuit, comprising:
   a power supply input configured to be coupled to a power supply voltage;
   a capacitor having a first end coupled to a reference potential;
   a resistor divider having a set of tap points, wherein at least one tap point is coupled to the reference potential;
   a comparator coupled to the power supply input and the reference potential, and having a comparator threshold dependent upon the power supply voltage;
   a first circuit coupled to a second end of the capacitor and configured to couple the power supply input to the resistor divider when a voltage on the second end of the capacitor is below a first circuit threshold;
   wherein the first circuit is configured to un-couple the power supply input from the resistor divider when the voltage on the second end of the capacitor is above the first circuit threshold;
   a second circuit configured to couple the second end of the capacitor to the power supply input when a voltage on at least one tap point of the resistor divider is above a second circuit threshold;
   wherein the comparator is coupled to at least one of the tap points, the reference potential, and a POR output; and wherein the comparator is configured to ramp-up a POR signal on the POR output when a voltage on the at least one of the tap points is greater than the comparator threshold.

2. The POR circuit of claim 1:
wherein the comparator is configured to ramp-down the POR signal on the POR output when the voltage on the at least one of the tap points is less than the comparator threshold.

3. The POR circuit of claim 1:
wherein the comparator threshold increases as the power supply voltage increases.

4. The POR circuit of claim 1:
wherein the first circuit is a single MOS transistor (M3).

5. The POR circuit of claim 4:
wherein the first circuit threshold is a voltage at the gate that turns-on the single MOS transistor.

6. The POR circuit of claim 4:
wherein a gate of the single MOS transistor is coupled to the second end of the capacitor and the second circuit.

7. The POR circuit of claim 4:
wherein a first doped region of the single MOS transistor is coupled to the power supply input; and wherein a second doped region of the single MOS transistor is coupled to the resistor divider.

8. The POR circuit of claim 1:
wherein the second circuit includes a first MOS transistor (M0) and a second MOS transistor (M2).

9. The POR circuit of claim 8:
wherein the second circuit threshold is a voltage at the gate that turns-on the first MOS transistor.

10. The POR circuit of claim 8:
wherein a gate of the first MOS transistor is coupled to the at least one tap point of the resistor divider;
wherein a first doped region of the first MOS transistor is coupled to the reference potential;
wherein a second doped region of the first MOS transistor is coupled to a gate of the second MOS transistor; and
wherein a first doped region of the second MOS transistor is coupled to the power supply input.

11. The POR circuit of claim 10:
wherein a second doped region of the second MOS transistor is coupled to the first circuit and the second end of the capacitor.

12. The POR circuit of claim 10:
wherein the first circuit is a single MOS transistor (M3); and
wherein the second doped region of the second MOS transistor is coupled to a gate of the single MOS transistor in the first circuit.

13. The POR circuit of claim 1:
wherein the first circuit is a single MOS transistor (M3);
wherein the second circuit includes a first MOS transistor (M0) and a second MOS transistor (M2);
wherein the single MOS transistor is a PMOS transistor;
wherein the first MOS transistor of the second circuit is an NMOS transistor;
wherein the second MOS transistor of the second circuit is a PMOS transistor; and
wherein the reference potential is a ground potential.

14. The POR circuit of claim 1:
wherein the comparator includes a PMOS transistor and an NMOS transistor coupled as an inverter having an inverter threshold.

15. The POR circuit of claim 14:
wherein gates of both transistors are coupled to a same tap point in the resistor divider; and wherein drains of both transistors are coupled to the POR output.

16. The POR circuit of claim 14:
wherein the comparator threshold is the inverter threshold;
wherein the inverter is configured to ramp-up the POR signal on the POR output when the voltage on the at least one of the tap points is greater than the inverter threshold; and
wherein the inverter is configured to ramp-down the POR signal on the POR output when the voltage on the at least one of the tap points is less than the inverter threshold.

17. The POR circuit of claim 1:
wherein the comparator includes a logic gate having a first input coupled to the at least one of the tap points and a second input coupled to the reference potential.

18. The POR circuit of claim 17:
wherein the comparator threshold is a logic decision threshold within the logic gate;
wherein the logic gate is configured to ramp-up the POR signal on the POR output when the voltage on the at least one of the tap points is greater than the logic decision threshold; and
wherein the logic gate is configured to ramp-down the POR signal on the POR output when the voltage on the at least one of the tap points is less than the logic decision threshold.

19. The POR circuit of claim 17:
wherein the logic gate is at least one of an AND gate, a NAND gate, an OR gate, a NOR gate, an XOR gate, or an XNOR gate.

20. The POR circuit of claim 17:
further comprising a logic inverter coupled between an output of the logic gate and the POR output.

21. A power on reset (POR) circuit, comprising:
a power supply input configured to be coupled to a power supply voltage;
a capacitor having a first end coupled to the power supply input;
a resistor divider having a set of tap points, wherein at least one tap point is coupled to the power supply input;
a comparator coupled to the power supply input and a reference potential, and having a comparator threshold dependent upon the power supply voltage;
a first circuit coupled to a second end of the capacitor and configured to couple the reference potential to the resistor divider when a voltage on the second end of the capacitor is above a first circuit threshold;
wherein the first circuit is configured to un-couple the reference potential from the resistor divider when the voltage on the second end of the capacitor is below the first circuit threshold;
a second circuit configured to couple the second end of the capacitor to the reference potential when a voltage on at least one tap point of the resistor divider is below a second circuit threshold;
wherein the comparator is coupled to at least one of the tap points, the power supply input, and a POR output; and
wherein the comparator is configured to ramp-up a POR signal on the POR output when a voltage on the at least one of the tap points is less than the comparator threshold.

* * * * *